(12) United States Patent
Byun et al.

(10) Patent No.: US 7,800,118 B2
(45) Date of Patent: Sep. 21, 2010

(54) ARRAY SUBSTRATE WITH REDUCED PIXEL DEFECT, METHOD OF MANUFACTURING THE SAME AND LIQUID CRYSTAL DISPLAY PANEL HAVING THE SAME

(75) Inventors: Jae-Seong Byun, Suwon-si (KR); In Sung Lee, Seoul (KR); Hoon-Kee Min, Seoul (KR); Hyun-su Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 66 days.

(21) Appl. No.: 11/957,147

(22) Filed: Dec. 14, 2007

(65) Prior Publication Data

US 2008/0093599 A1 Apr. 24, 2008

Related U.S. Application Data

(63) Continuation of application No. 11/220,933, filed on Sep. 6, 2005.

(30) Foreign Application Priority Data

Sep. 8, 2004 (KR) ........................ 10-2004-0071570

(51) Int. Cl.
*H01L 33/42* (2010.01)
*G02F 1/1343* (2006.01)

(52) U.S. Cl. ........................... 257/79; 349/139; 438/30; 438/158; 257/E33.062; 257/E33.065

(58) Field of Classification Search .................. 438/30, 438/158, 666, FOR. 200; 349/139; 257/79, 257/E33.062, E33.065
See application file for complete search history.

(56) References Cited

U.S. PATENT DOCUMENTS

| 6,204,081 | B1 * | 3/2001 | Kim et al. ................. 438/30 |
| 6,458,613 | B1 * | 10/2002 | Bae ......................... 438/30 |
| 6,586,286 | B2 * | 7/2003 | Park et al. ................ 438/155 |
| 7,112,459 | B2 * | 9/2006 | Chen ....................... 438/30 |
| 7,119,368 | B2 * | 10/2006 | Park et al. ................ 257/59 |
| 2001/0040662 | A1 * | 11/2001 | Cheng et al. ............. 349/141 |
| 2005/0037528 | A1 * | 2/2005 | Chen ....................... 438/30 |
| 2006/0160282 | A1 * | 7/2006 | Kim et al. ................. 438/149 |
| 2006/0180815 | A1 * | 8/2006 | Sarma et al. .............. 257/66 |
| 2006/0186414 | A1 * | 8/2006 | Hwang et al. ............. 257/72 |
| 2006/0228821 | A1 * | 10/2006 | Hong et al. ............... 438/30 |

* cited by examiner

*Primary Examiner*—George Fourson
(74) *Attorney, Agent, or Firm*—Innovation Counsel LLP

(57) ABSTRACT

An array substrate includes a transparent substrate, a switching element, an insulating layer and a pixel electrode. The switching element includes a gate electrode formed on the transparent substrate and connected to a gate line, a channel layer formed on the gate electrode and extended in a first direction, a source electrode formed on the transparent substrate and connected to a source line and a drain electrode formed on the channel layer to cover the channel layer. The insulating layer has a contact hole to partially expose the drain electrode and the transparent substrate. The pixel electrode is connected to the drain electrode through the contact hole. When the above array substrate is employed in a liquid crystal display panel, the array substrate reduces pixel defect.

22 Claims, 14 Drawing Sheets

ARRAY SUBSTRATE WITH REDUCED PIXEL DEFECT, METHOD OF MANUFACTURING THE SAME AND LIQUID CRYSTAL DISPLAY PANEL HAVING THE SAME

CROSS-REFERENCE TO RELATED APPLICATIONS

This application is a Continuation of U.S. patent application Ser. No. 11/220,933 filed on Sep. 6, 2005, now U.S. Pat. No. 7,319,240, which claims priority to and the benefit of Korean Patent Application No. 10-2004-0071570, filed Sep. 8, 2004, the disclosures of which are incorporated herein by reference in their entireties.

This application relies for priority upon Korean Patent Application No. 2004-71570 filed on Sep. 8, 2004, the content of which is herein incorporated by reference in its entirety.

BACKGROUND OF THE INVENTION

1. Field of the Invention

The present invention relates to an array substrate, a method of manufacturing the array substrate and a liquid crystal display panel including the array substrate. More particularly, the present invention relates to an array substrate of decreased pixel defect, a method of manufacturing the array substrate and liquid crystal display panel including the array substrate.

2. Description of the Related Art

In general, a liquid crystal display apparatus includes a liquid crystal display panel and a driving part to drive the liquid crystal display panel. The liquid crystal display panel includes an array substrate, a color filter substrate and a liquid crystal layer disposed between the array substrate and the color filter substrate.

The array substrate includes a plurality of data lines and gate lines that are usually arranged in a grid pattern, and a plurality of pixel areas defined by the data and the gate lines. A switching element, a liquid crystal capacitor and a storage capacitor are formed in the pixel area.

A gate electrode of the switching element is connected to the gate line. A source electrode of the switching element is connected to the data line. A drain electrode of the switching element is connected to a pixel electrode that functions as a first electrode of the liquid crystal capacitor. The storage capacitor is defined by the gate electrode and the pixel electrode.

The color filter substrate corresponds to the pixel area and includes a color filter pattern and a common electrode that functions as a second electrode of the liquid crystal capacitor.

A contact hole is formed by partially etching a passivation layer coated on the drain electrode to electrically connect the drain electrode and the pixel electrode.

In etching a passivation layer, the semiconductor layer that is formed beneath the drain electrode is sometimes undercut from an overetching of the passivation layer. The undercutting induces subsidence and separation of the drain electrode. When this happens, the drain electrode does not apply an electric field to the pixel electrode, and the pixel becomes defective.

SUMMARY OF THE INVENTION

The present invention provides an array substrate of decreased pixel defect. The present invention also provides a method of manufacturing the above array substrate and a liquid crystal display panel including the above array substrate.

In accordance with an aspect of the present invention, there is provided an array substrate including a transparent substrate, a switching element, an insulating layer and a pixel electrode. The switching element includes a gate electrode formed on the transparent substrate and connected to a gate line, a channel layer formed on the gate electrode and extending in a first direction, a source electrode connected to the source line, and a drain electrode formed on the channel layer to cover the channel layer. The insulating layer includes a passivation layer, and the passivation layer has a contact hole to partially expose the drain electrode and the transparent substrate. The pixel electrode is connected to the drain electrode through the contact hole.

The contact hole may include a first exposing part to partially expose the drain electrode, and a second exposing part to expose the transparent substrate adjacent to the exposed drain electrode. The contact hole may have a substantially rectangular or U-shaped cross section. The second exposing part exposes the transparent substrate adjacent to the drain electrode exposed by the first exposing part. Where the contact hole is U-shaped, the first exposing part corresponds to a curved portion of the U-shape, and the second exposing part corresponds to the end portions of the U-shape.

The contact hole may include a first stepped portion formed between the passivation layer and the drain electrode, and a second stepped portion formed between the drain electrode and the transparent substrate.

In accordance with another aspect of the present invention, there is provided a method of manufacturing an array substrate. A plurality of gate lines and a gate electrode connected to the gate line are formed on a transparent substrate. A channel layer extending in a first direction is formed on the gate electrode. A plurality of source lines, a source electrode connected to the source electrode and a drain electrode that covers the channel layer are formed on the transparent substrate. An insulating layer having a contact hole partially exposing the drain electrode and the transparent substrate is formed on the transparent substrate. A pixel electrode layer connected to the drain electrode through the contact hole is formed on the insulating layer.

In accordance with yet another aspect of the present invention, there is provided a liquid crystal display panel including a liquid crystal layer, a first substrate and a second substrate corresponding to the first substrate, and receiving a liquid crystal layer by combining with the first substrate. The second substrate includes a transparent substrate, a channel layer formed on the transparent substrate and extending in a first direction, a switching element including a drain electrode that covers the channel layer, an insulating layer having a contact hole to partially expose the drain electrode and the transparent substrate and a pixel electrode connected to the drain electrode through the contact hole.

The contact hole may have a substantially rectangular or U-shaped cross section.

In accordance with the present invention, the above array substrate may be employed to the liquid crystal display panel to prevent a malfunction of the drain electrode, and to reduce pixel defect.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE EMBODIMENTS

Figure 1:
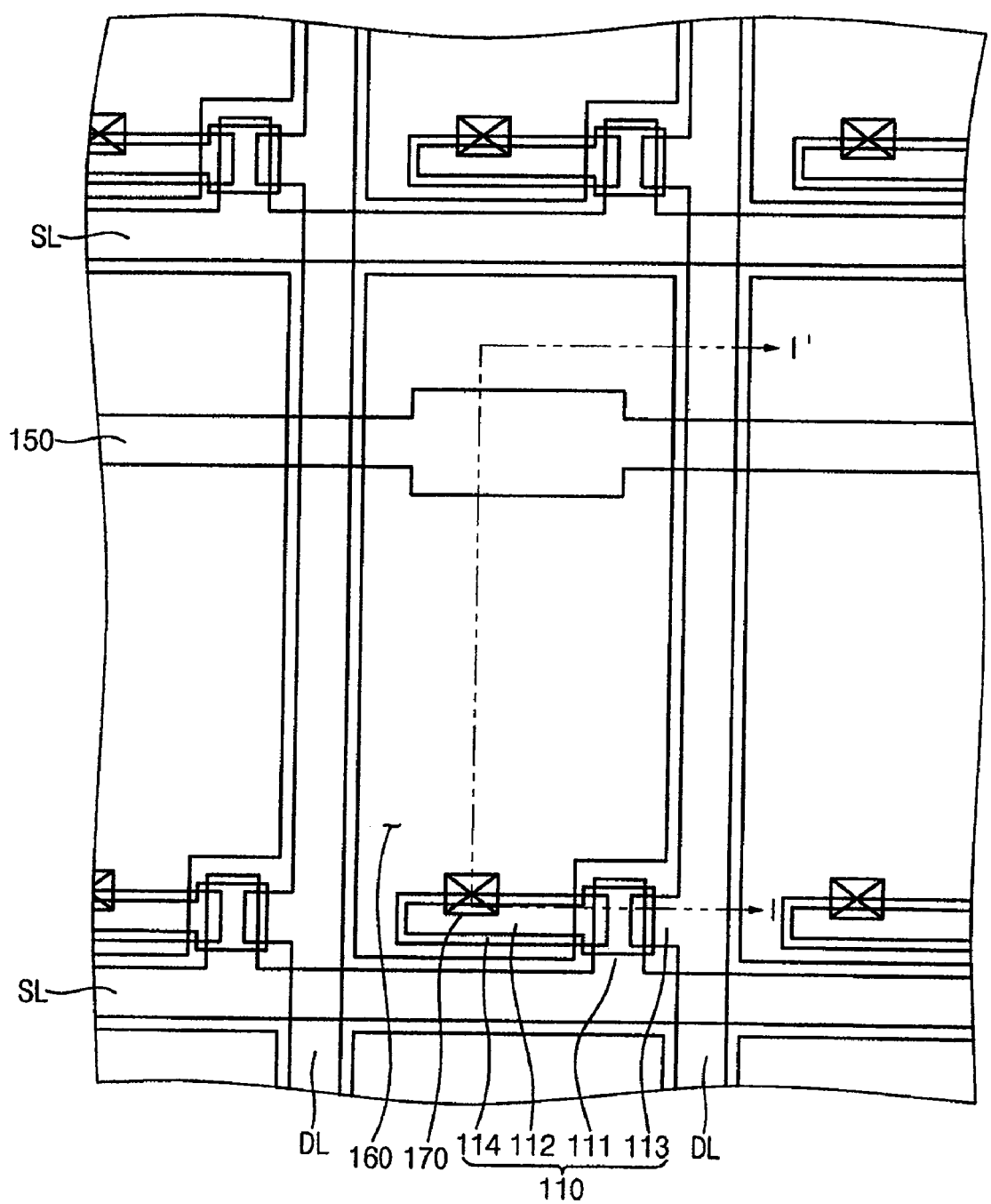
FIG. 1 is a plan view illustrating an array substrate in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as what is commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating an array substrate in accordance with an exemplary embodiment of the present invention.

Referring to FIG. 1, an array substrate includes a plurality of gate lines SL formed along a first direction, a plurality of data lines DL (or source lines) formed along a second direction that is substantially in perpendicular to the first direction, and a plurality of pixel areas defined by the gate lines SL and the data lines DL adjacent to each other.

The pixel area includes a switching element 110, a storage capacitor (CST) (not shown) electrically connected to the switching element 110 and a pixel electrode 160 that functions as a first electrode of a liquid crystal capacitor (not shown).

The switching element 110 includes a gate electrode 111 connected to the gate line SL, a source electrode 113 connected to the data line DL and a drain electrode 114 connected to the pixel electrode 160 through a contact hole 170. A channel layer 112 is formed between the gate electrode 111 and both the source and drain electrodes 113 and 114. The drain electrode 114 covers the channel layer 112 formed beneath the drain electrode 114. The contact hole 170 exposes a portion of the drain electrode 114, and the exposed drain electrode 114 covers the channel layer 112. Therefore, an undercut formed in the channel layer 112 may be prevented when forming the contact hole 170, and thus a defective pixel caused by subsidence and separation of the drain electrode 114 may be reduced.

The storage capacitor includes a first electrode 150 formed from the same layer as the gate line SL and the pixel electrode 160 as a second electrode. The first electrode 150 may be formed along the data line DL that defines the pixel area. The first electrode 150 may be substantially ring-shaped along the sides of the pixel area to improve an aperture ratio. The storage capacitors formed in the pixel areas are connected to each other. The storage capacitors are electrically connected to each other through the contact hole 170, and the storage capacitors are electrically connected to each other through the extended first electrode. When the switching element 110 is turned off, the storage capacitor maintains an electric field applied to the liquid crystal capacitor by using an electric charge stored in the storage capacitor.

Figure 2:
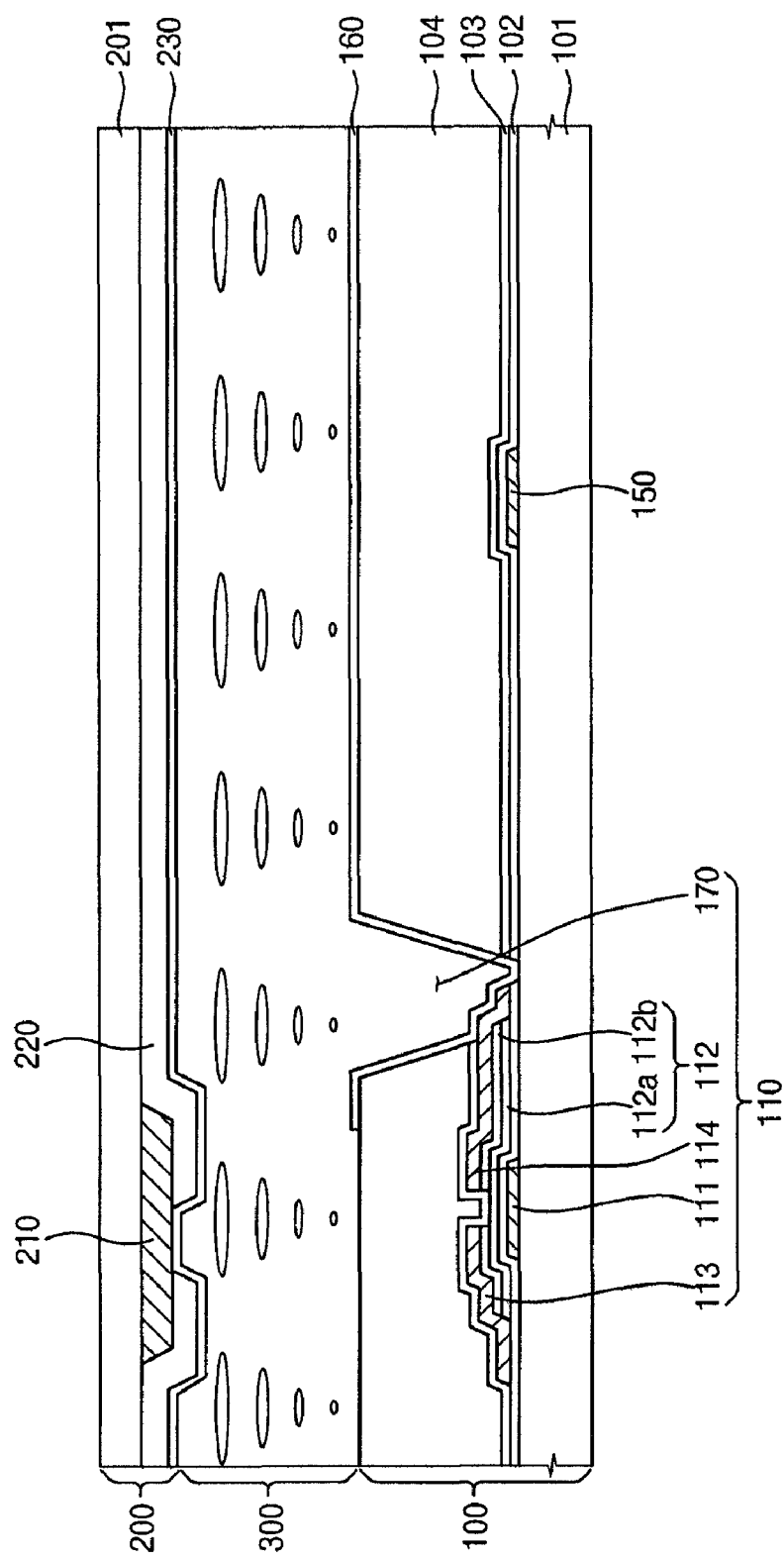
FIG. 2 is a cross-sectional view of liquid crystal display panel taken along a line I-I' in FIG. 1.

FIG. 2 is a cross-sectional view illustrating a liquid crystal display panel taken along a line I-I' in FIG. 1.

Referring to FIGS. 1 and 2, a liquid crystal display panel includes an array substrate 100, a color filter substrate 200 and a liquid crystal layer 300 disposed between the array substrate 100 and the color filter substrate 200.

The array substrate 100 includes a first transparent substrate 101. The gate electrode 111 and the gate lines SL are formed on the first transparent substrate 101 by patterning a gate metal layer on the array substrate 100. Also, the first electrode 150 of the storage capacitor (CST) is formed on the first transparent substrate 101 by patterning the gate metal layer on the array substrate 100. A first insulating layer 102 as a gate insulating layer is formed on the gate metal layer.

The channel layer 112 (or semiconductor layer) including a semiconductor material is formed on the first insulating layer 102 corresponding to the gate electrode 111. The channel layer 112 includes an active layer 112a and a resistance contact layer 112b. The channel layer 112 is formed along the drain electrode 114 from the gate electrode 111.

The data line DL, and the source and drain electrodes 113 and 114 of the switching element 110 are formed by patterning the source and drain metal layers on the gate metal layer. The drain electrode 114 covers the channel layer 112 formed beneath the drain electrode 114.

The passivation layer 103 is formed on the source and drain metal layers (source and drain electrodes). A second insulating layer 104 is formed on the passivation layer 103. Alternatively, the second insulating layer may not be formed on the passivation layer 103.

The contact hole 170 partially exposes the drain electrode 114, and is formed by patterning the passivation layer 103 and the second insulating layer 104. The contact hole 170 has a substantially rectangular shape in plan view. The contact hole 170 has a first exposing part (not shown) to partially expose the drain electrode 114 and a second exposing part (not shown) to partially expose a portion of the first transparent substrate 101 that is adjacent to the drain electrode 114. The drain electrode 114 covers the channel layer 112 to prevent the undercut when forming the contact hole 170 is formed.

The pixel electrode 160 is formed on the second insulating layer 104 by patterning a transparent electrode layer on the second insulating layer 104. The pixel electrode 160 is electrically connected to the drain electrode 114 through the contact hole 170.

The color filter substrate 200 includes a second transparent substrate 201, a light-blocking layer 210, a color pixel pattern 220 and a transparent electrode layer 230. The light-blocking layer 210 and the color pixel pattern 220 are formed on the transparent substrate 201. The light-blocking layer 210 defines a recess portion in the color pixel pattern 220 on the transparent substrate 201, and prevents light leakage.

The color pixel pattern 220 is formed in the recess portion of the pixel unit. The color pixel pattern 220 expresses colors in response to incident light. The color pixel pattern 220 typically includes red, green and blue color patterns.

The transparent electrode layer 230 functions as a common electrode 230 that corresponds to the pixel electrode 160, and a common voltage is applied to the common electrode 230. The liquid crystal capacitor (CLC) is defined by the pixel electrode 160 as a first electrode, and the common electrode 230 as a second electrode. The color filter substrate 200 may further include a planarization layer formed on the blocking layer 210 and the color pixel pattern 220. The planarization layer protects and planarizes the light-blocking layer 210 and the color pixel pattern 220.

The liquid crystal layer 300 is disposed between the array substrate 100 and the color filter substrate 200. The arrangement of liquid crystals is changed in response to an intensity of an electric field formed between the common electrode 230 and the pixel electrode 160.

FIGS. 3 to 9 are views illustrating a method of manufacturing the array substrate in FIG. 1.

Figure 3:
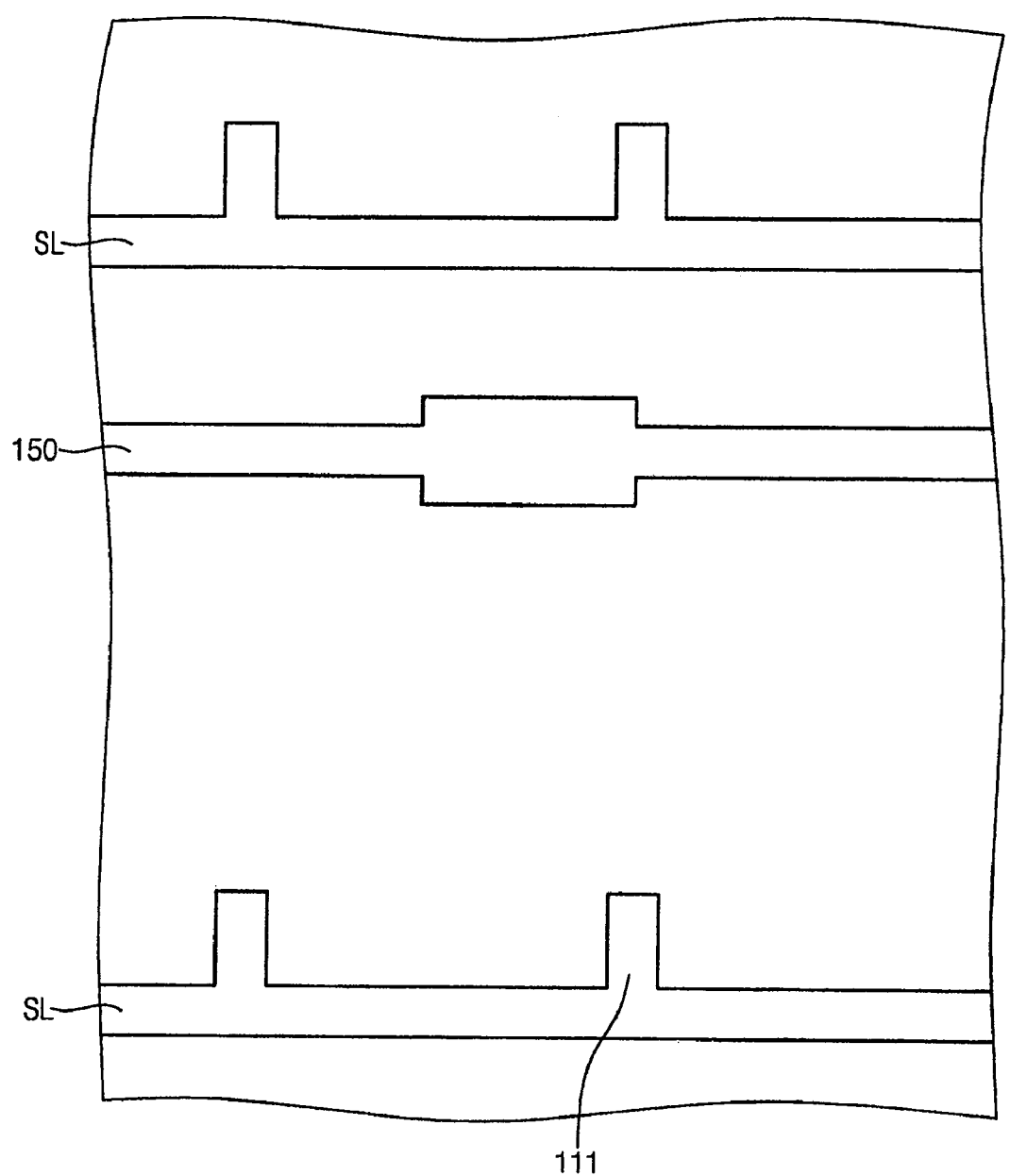
FIGS. 3 to 9 are views illustrating a method of manufacturing an array substrate in FIG. 1.
Figure 4:
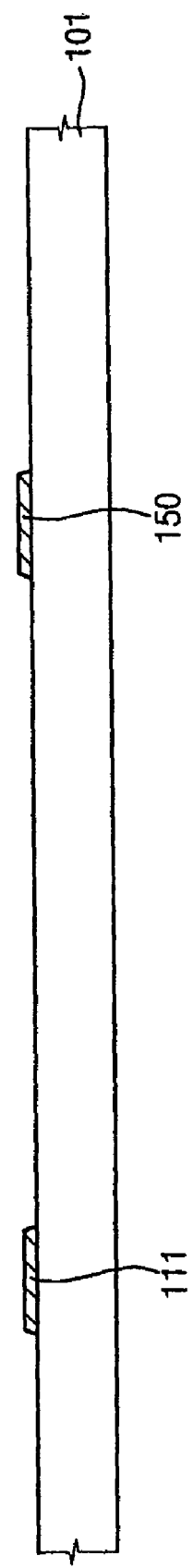

Referring to FIGS. 3 and 4, a gate metal layer is formed on a transparent substrate 101 by depositing a metal such as aluminum (Al), copper (Cu), etc., onto the transparent substrate 101 using a process such as a sputtering process, a chemical vapor deposition process, etc. A gate electrode 111 of the switching element 110, gate lines SL and a first electrode 150 of a storage capacitor are formed on the transparent substrate 101 by patterning the gate metal layer through a photolithography process.

Figure 5:
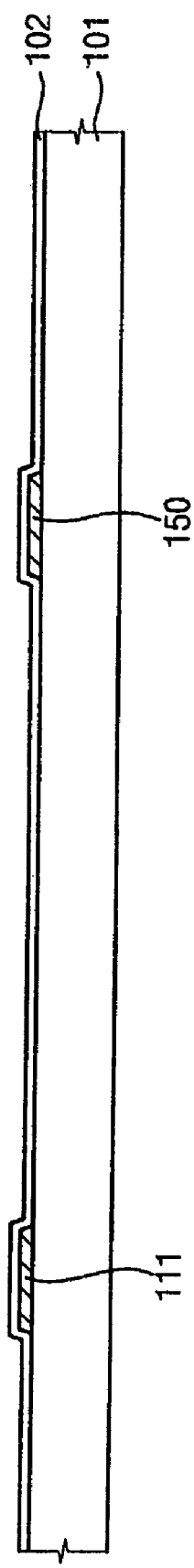

Referring to FIG. 5, a first insulating layer 102 is deposited on the transparent substrate 101 to cover the gate metal layer. The first insulating layer 102 includes an insulating material such as silicon nitride, silicon oxide, etc.

Figure 6:
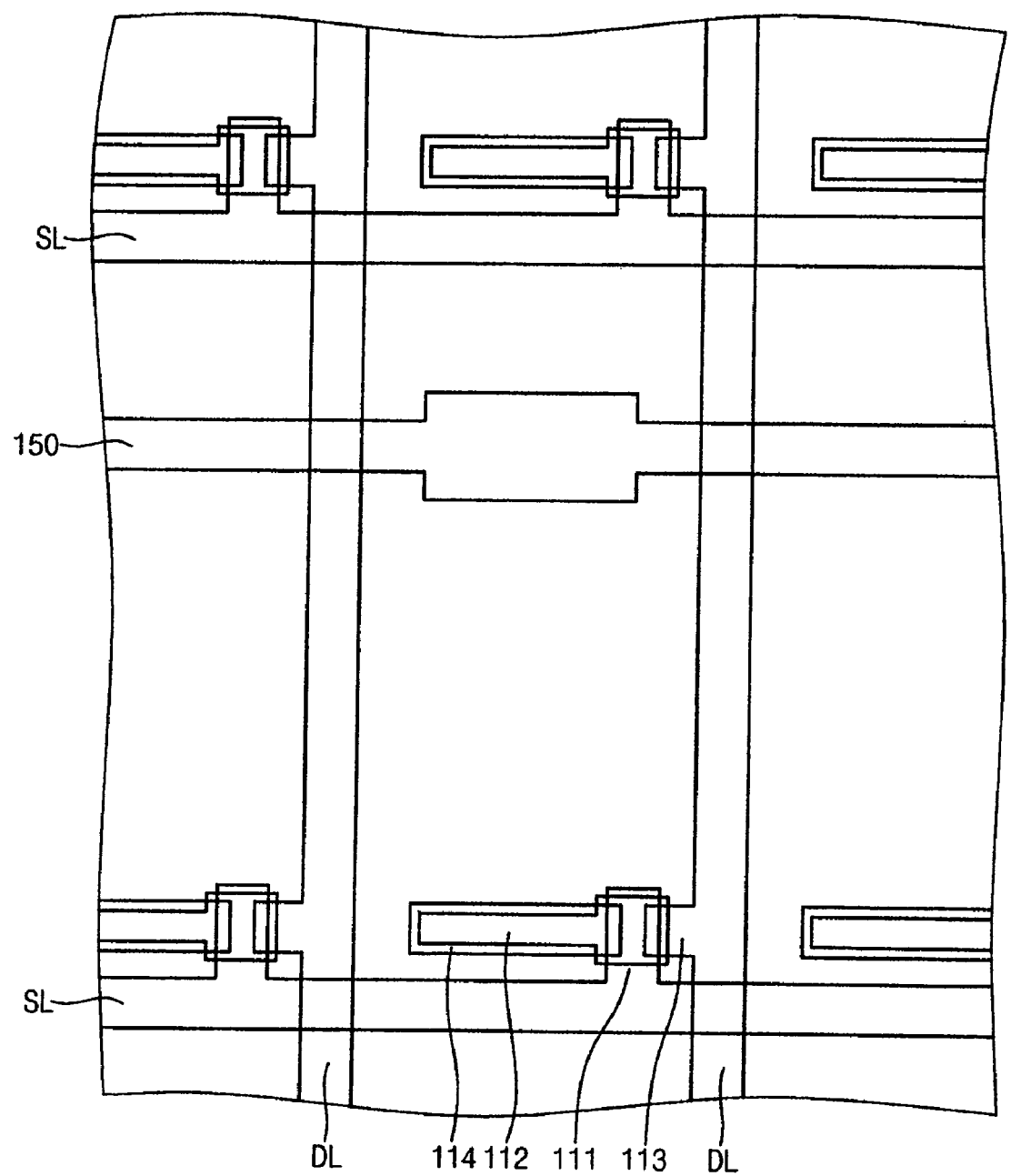
Figure 7:
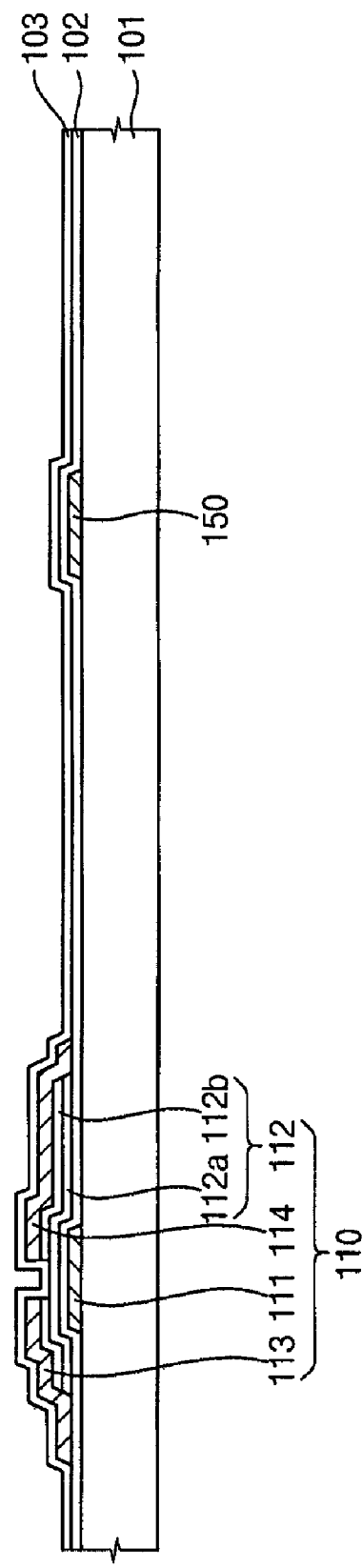

Referring to FIGS. 6 and 7, an active layer 112a and a resistance contact layer 112b of a channel layer 112 are deposited sequentially on the first insulating layer 102. The active layer 112a includes an amorphous silicon layer (a-Si) and the resistance contact layer 112b includes an amorphous silicon doped with a dopant ($N^+$ a-Si).

The active layer 112a and the resistance contact layer 112b are patterned to form the active layer 112a and the resistance contact layer 112b on an area corresponding to the gate and drain electrodes 111 and 114. The photolithography process includes coating a photoresist material to form a photoresist layer, exposing the photoresist layer, developing the exposed photoresist layer to form a photoresist pattern and partially etching an underlying layer using the photoresist pattern as an etching mask.

Subsequently, source and drain metal layers are deposited on the resistance contact layer 112b, and a photoresist pattern (not shown) is formed by exposing and developing the coated photoresist layer. Then, data lines DL, and the source and drain electrodes 113 and 114 are formed by etching the source and drain metal layers by using the photoresist pattern as an etching mask. The drain electrode 114 is formed on the channel layer 112 to cover the channel layer 112. The resistance contact layer 112b is etched using the source and drain electrodes 113 and 114 as an etching mask, so as to form a channel layer 112 in the switching element 110.

A passivation layer 103 is formed on the source and drain metal layers. A second insulating layer 104 is formed on the passivation layer 103. The second insulating layer 104 includes an inorganic insulating material such as silicon nitride, silicon oxide, etc. Also, the insulating layer 104 may include an organic insulating material of a low dielectric constant such as an acrylic compound, Teflon, benzocyclobutene (BCB), cytop, perfluorocyclobutane (PFCB), etc.

Figure 8:
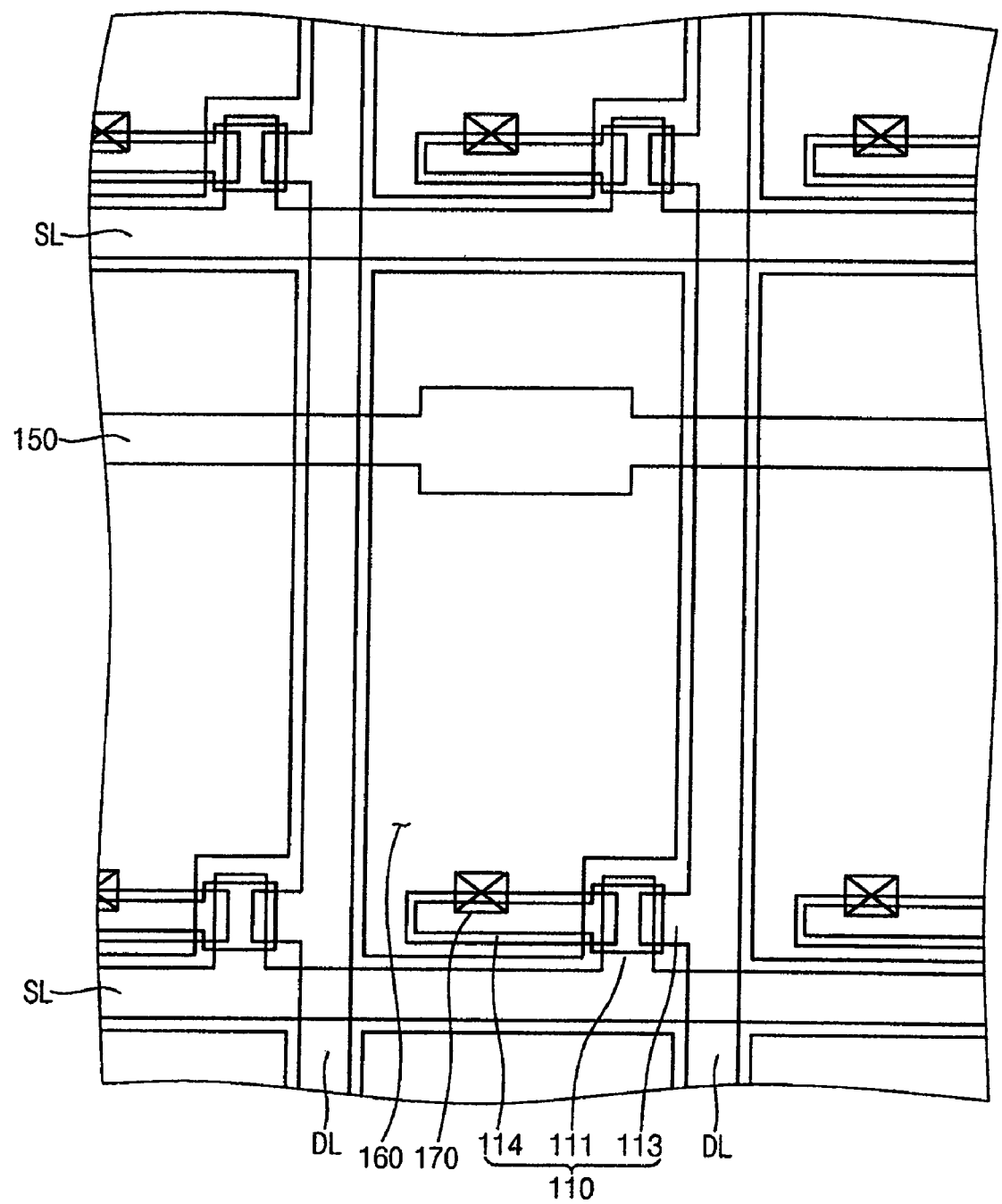
Figure 9:
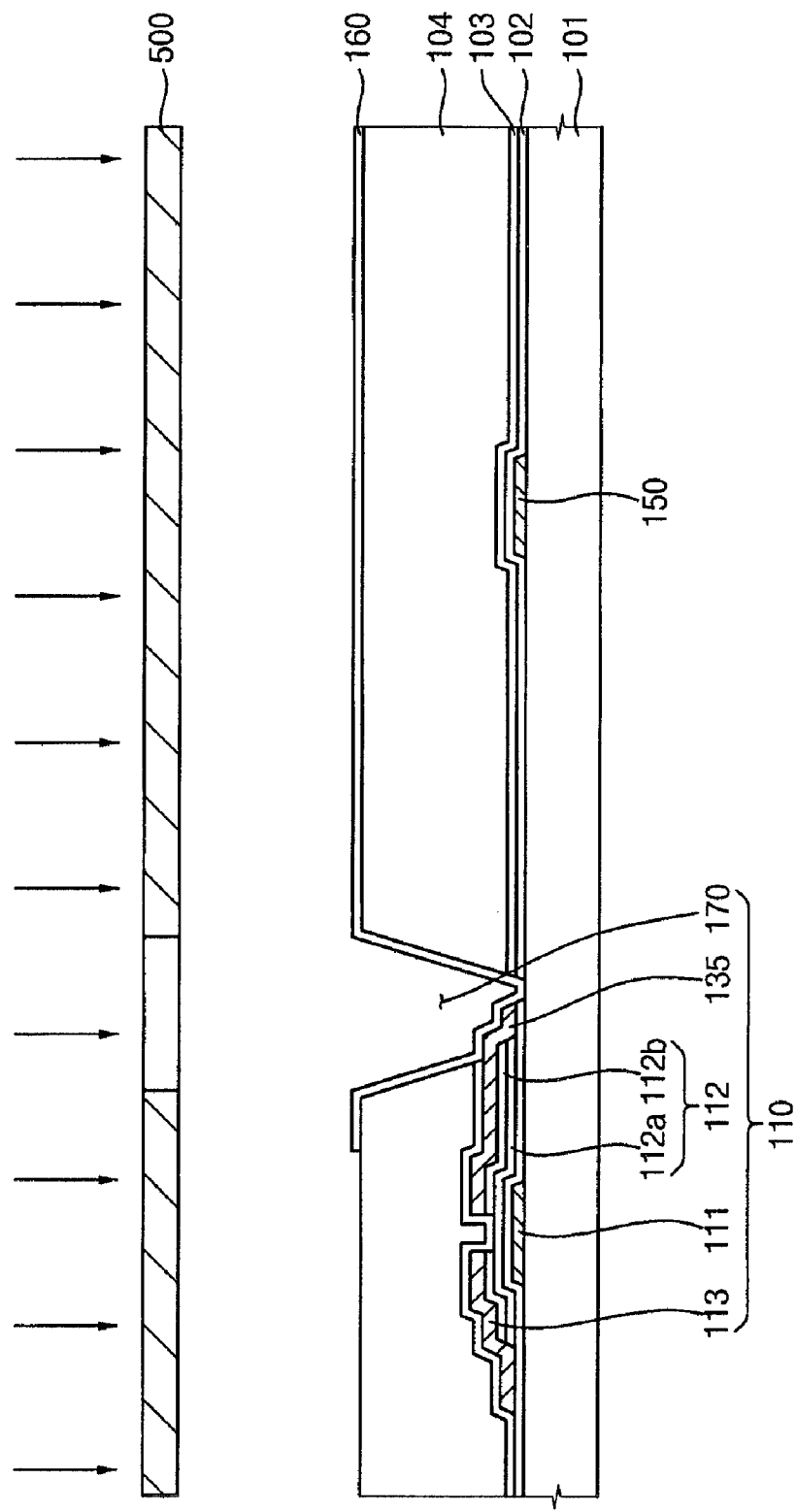

Referring to FIGS. 8 and 9, a contact hole 170 is formed in the passivation layer 103 and the second insulating layer 104 by using a mask 500.

The contact hole is formed by a photolithographic method. According to the photolithographic method, a photoresist pattern is formed by selectively exposing portions of the photoresist to light by using the mask 500 and developing the exposed photoresist. The contact hole 170 has a substantially rectangular shape in plan view. The contact hole 170 includes a first exposing part to partially expose the drain electrode 114 and a second exposing part to partially expose a portion of the transparent substrate 101 adjacent to the exposed drain electrode 114. The contact hole 170 partially exposes the drain electrode 114, and the exposed drain electrode 114 covers the channel layer 112. According to the above, the channel layer 112 is not exposed, so that an undercutting of the channel layer 112 is prevented when etching the passivation layer 103 and the second insulating layer 104.

A transparent electrode layer including a transparent and conductive material is disposed on the second insulating layer 104. Examples of the transparent and conductive material include indium tin oxide (ITO), indium zinc oxide (IZO), indium tin zinc oxide (ITZO), etc. The deposited transparent and conductive material is patterned to form the pixel electrode 160 in a pixel area. Also, the pixel electrode 160 is electrically connected to the drain electrode 114 through the contact hole 170. No undercutting happens in the channel layer 112, and the drain electrode 114 is securely connected to the pixel electrode 160. Therefore, an electric field is readily applied to the pixel electrode 160.

Figure 10:
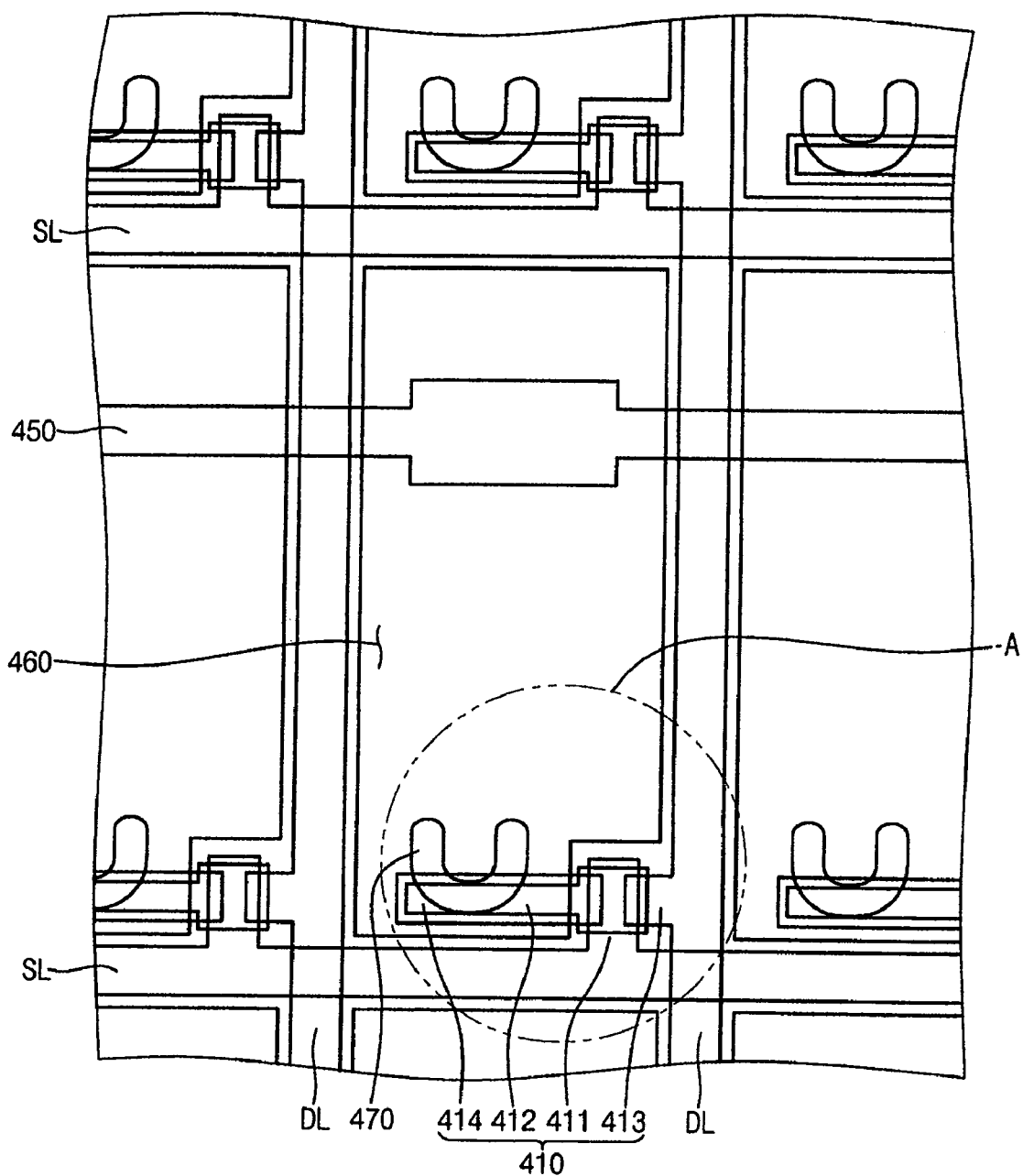
FIG. 10 is a plan view illustrating an array substrate in accordance with another exemplary embodiment of the present invention.

FIG. 10 is a plan view illustrating a part of an array substrate in accordance with another exemplary embodiment of the present invention.

Referring to FIG. 10, an array substrate includes a plurality of gate lines SL formed along a first direction, a plurality of data lines DL (or source lines) formed along a second direction that is substantially in perpendicular to the first direction, and a plurality of pixel areas defined by the gate lines SL and the data lines DL.

The pixel area includes a switching element (TFT) 410, a storage capacitor (CST, not shown) electrically connected to the switching element 410 and a pixel electrode 460 functioning as one electrode of a liquid crystal capacitor (CLC, not shown).

The switching element 410 includes a gate electrode 411 connected to the gate line SL, a source electrode 413 connected to the data line DL and a drain electrode 414 connected to the pixel electrode 460 through a contact hole 470. A channel layer 412 is formed between the gate electrode 411 and both the source and drain electrodes 413 and 414. The drain electrode 414 covers the channel layer 412 formed beneath the drain electrode 414.

Accordingly, the channel layer 412 is not undercut when forming the contact hole 470 by etching a passivation layer 403 and a second insulating layer 404. Therefore, generation of a defective pixel from subsidence and separation of the drain electrode 414 is prevented.

The contact hole 470 includes a first exposing part to partially expose the drain electrode 414, and second exposing part to partially expose a portion of the transparent substrate 401 adjacent to the exposed drain electrode 414. The contact hole 470 has a substantially U-shape in plan view. The contact hole 470 that corresponds to the curved portion of the U-shape exposes the drain electrode 414, and the contact hole 470 that corresponds to the end portions of the U-shape exposes the transparent substrate 401 adjacent to the exposed drain electrode 414.

The storage capacitor (CST) includes a first electrode 150 formed from the same layer as the gate line SL and the pixel electrode 160 as a second electrode.

Figure 11:
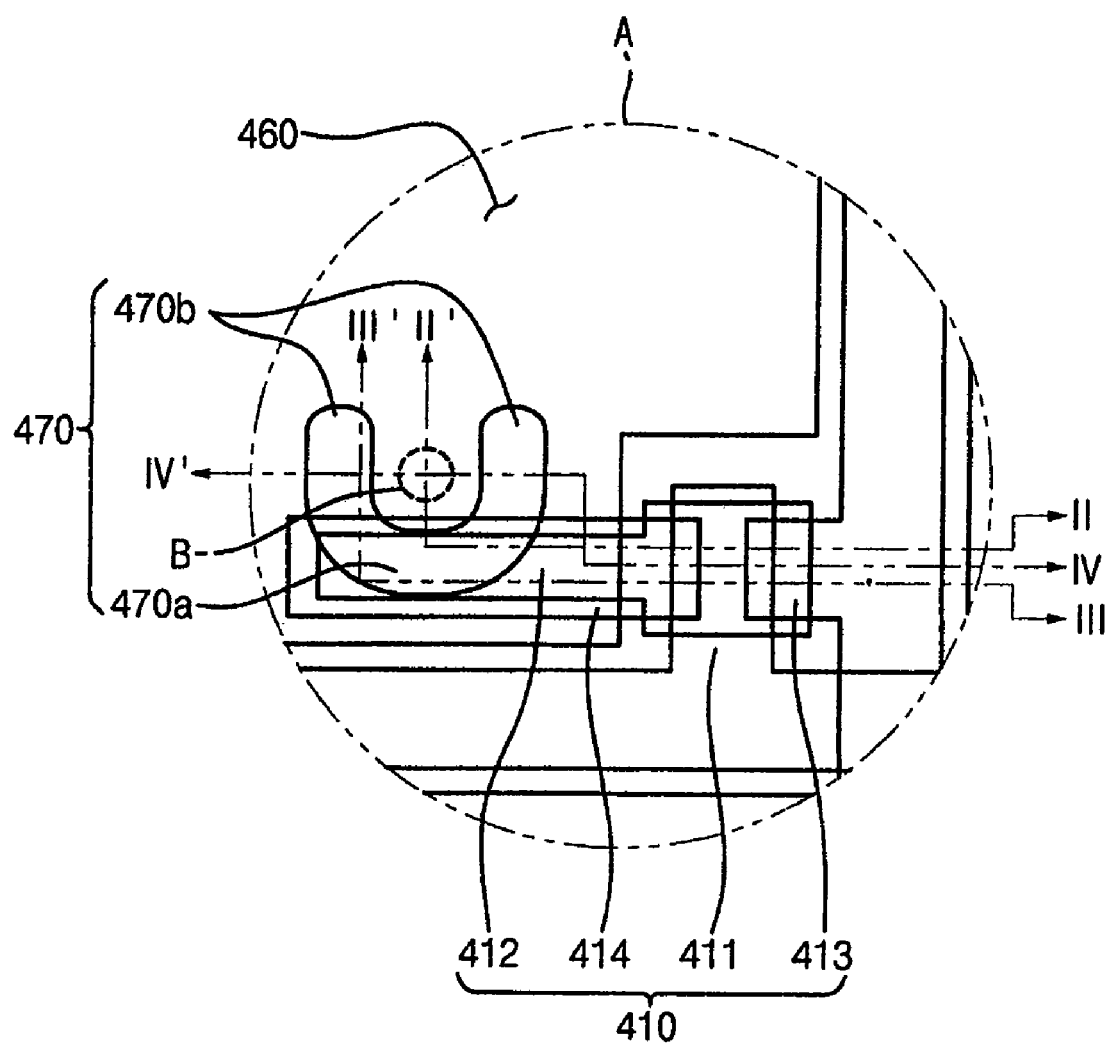
FIG. 11 is an enlarged view of a portion "A" in FIG. 10.
Figure 12:
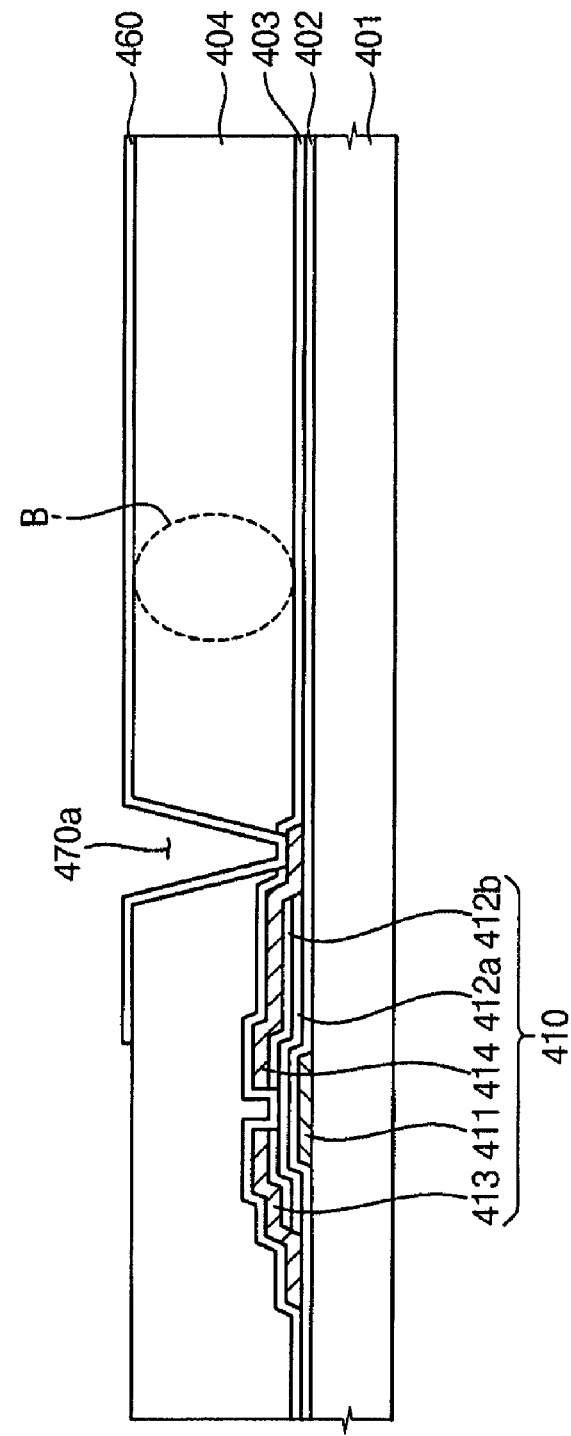
FIG. 12 is a cross-sectional view taken along a line II-II' in FIG. 11.
Figure 13:
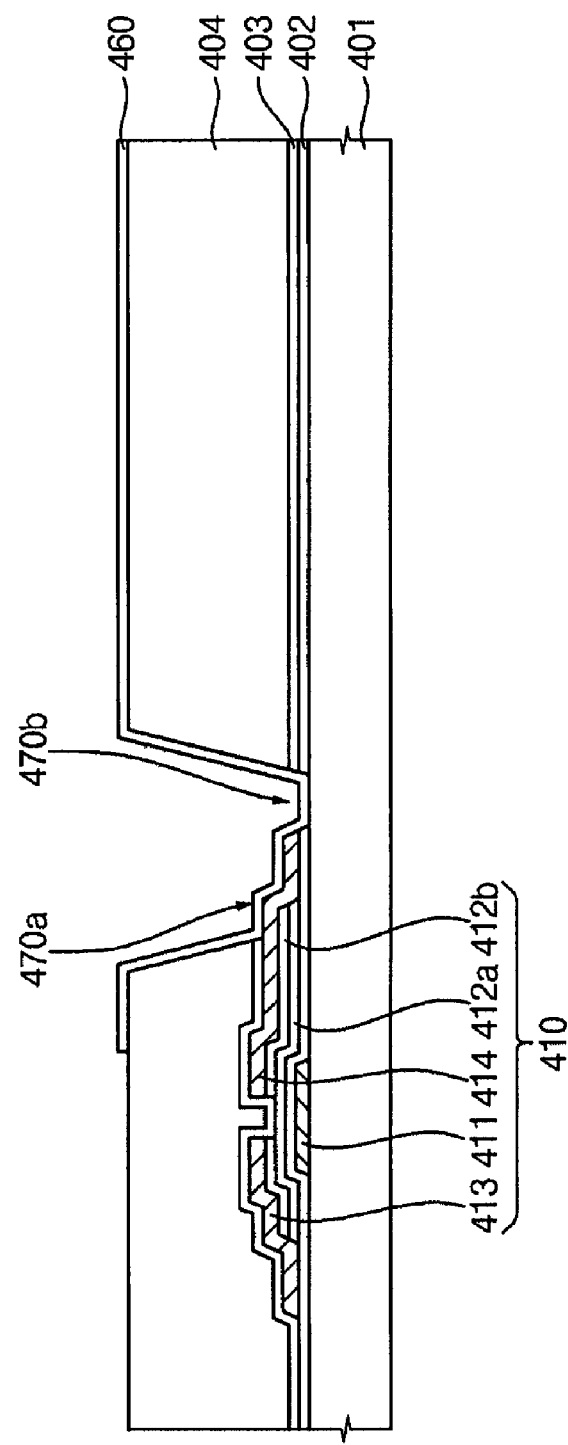
FIG. 13 is a cross-sectional view taken along a line III-III' in FIG. 11.
Figure 14:
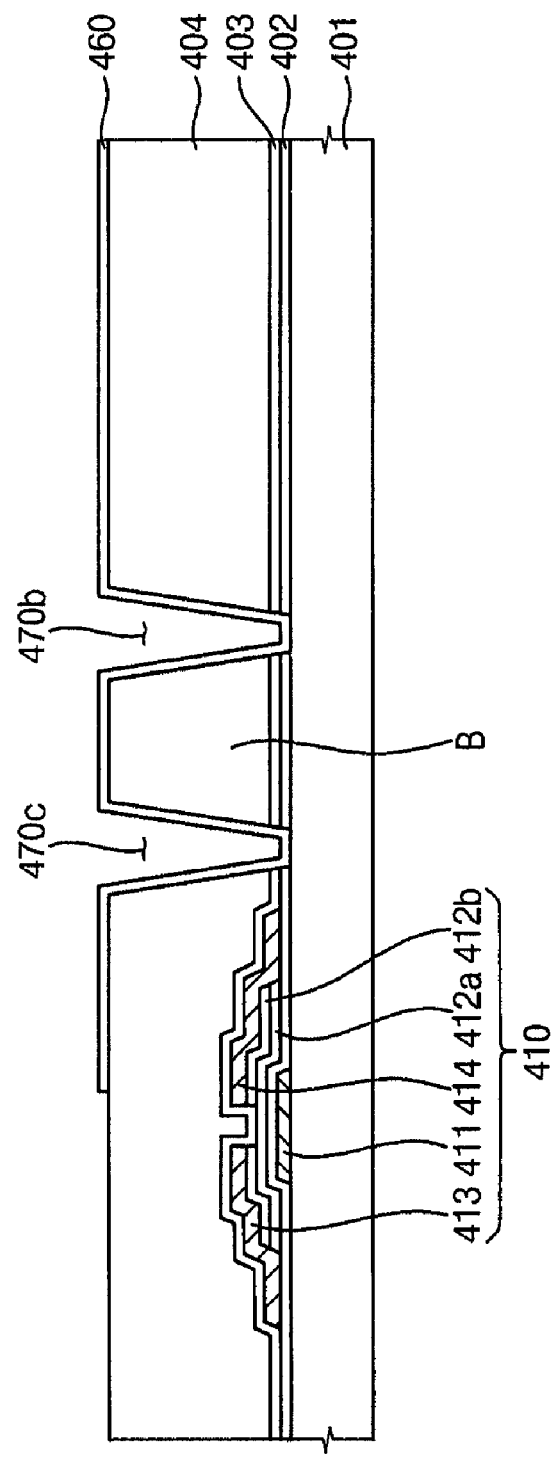
FIG. 14 is a cross-sectional view taken along a line IV-IV'.

FIG. 11 is an enlarged view of a portion "A" in FIG. 10. FIG. 12 is a cross-sectional view taken along a line II-II' in FIG. 11. FIG. 13 is a cross-sectional view taken along a line III-III' in FIG. 11. FIG. 14 is a cross-sectional view taken along a line IV-IV'.

Referring to FIG. 11, the switching element 410 and the pixel electrode 460 connected to the switching element 410 are formed in the pixel area. The switching element 410 includes the gate electrode 411, the source and drain electrodes 413 and 414, and the channel layer 412 formed between the gate electrode and both the source and drain electrodes 413 and 414. The channel layer 412 is extended along the drain electrode 414, and is covered by the drain electrode 414. The drain electrode 414 is partially connected to the pixel electrode 460 through the contact hole 470 having the substantially U-shape.

Referring to FIGS. 11 and 12, the contact hole 470 includes a first exposing part 470a to partially expose the drain electrode 414, and a second exposing part 470b to partially expose a portion of the transparent substrate 401 adjacent to the exposed drain electrode 414. The first exposing part 470a corresponds to the curved portion of the U-shape, and the second exposing part 470b corresponds to the end portions of the U-shape.

A support area 'B' formed between the second exposing parts 470b of the end portions of the U-shape, is not etched to support the contact hole 470. Therefore, the support area 'B' prevents the drain electrode 414 from subsidence and separation.

Referring to FIG. 13, the gate electrode 411 is formed on the transparent substrate 401, and a first insulating layer 402 is formed on the gate electrode 411. An active layer 412a and a resistance contact layer 412b are sequentially formed on an area corresponding to the gate electrode 411 to form the channel layer 412. The source and drain electrodes 413 and 414 are formed on a part of the channel layer 412, and the source and drain electrodes 413 and 414 partially overlap the channel layer 412 (412a+412b). The drain electrode 414 covers the channel layer 412 extended toward the drain electrode 414.

The passivation layer 403 is formed on the source and drain electrodes 413 and 414. In addition, the second insulating layer 404 is formed on the passivation layer 403. Alternatively, the second insulating layer 404 may not be formed on the passivation layer 403.

The contact hole 470 having the substantially U-shape is partially formed in the second insulating layer and the passivation layer 404 to connect the pixel electrode 460 to the drain electrode 414 of the switching element 410. The first exposing part 470a partially exposes the drain electrode 414, and the second exposing part 470b partially exposes a portion of the transparent substrate 410 adjacent to the exposed drain electrode 414. The second exposing part 470b minimizes an adjacent region in which the drain electrode 414 makes contact with the transparent substrate 401, to thereby prevent the undercutting caused by over-etching the channel layer 412.

The contact hole 470 includes a first stepped portion formed between the passivation layer 403 and the drain electrode 414, and a second stepped portion formed between the drain electrode 414 and the transparent substrate 401. Therefore, the pixel electrode 460 also has first and second stepped portions.

The drain electrode 414 entirely covers the channel layer 412, thereby reducing a loss of the channel layer 412 while forming the contact hole 470. Furthermore, a defective pixel that forms as a result of subsidence and separation of the drain electrode 414 is reduced.

Referring to FIG. 14, the second exposing parts 470b and 470c partially expose a portion of the transparent substrate 401. A support area 'B' is formed between the second exposing parts 470b, 470c. The support area 'B' is not etched, and therefore supports the contact hole 470. The support area 'B' prevents the drain electrode 414 from subsidence and separation.

The end portions 470b (the second exposing parts) minimizes the area that contacts the drain electrode 414 and the transparent substrate 401, thus preventing the undercutting of the channel layer 412a, 412b caused by over-etching.

According to the above, the defective pixel caused by subsidence and separation of the drain electrode 414 formed on the channel layer 412 is prevented.

As described above, in the present invention, the drain electrode is formed so as to cover the channel layer (or semiconductor layer) formed under the drain electrode. This way, the undercutting of the channel layer during the etching of the contact hole at a predetermined region above the drain electrode is reduced or even prevented. Thus, subsidence and separation of the drain electrode formed on the channel layer is prevented.

Further, the contact hole having the substantially U-shape is partially formed in the second insulating layer and the passivation layer to connect the pixel electrode to the drain electrode and the switching element. The first exposing part of the contact hole partially exposes the drain electrode, and the second exposing part of the contact hole partially expose the transparent substrate adjacent to the exposed drain electrode. The second exposing part minimizes an adjacent region in which the drain electrode makes contact with the transparent substrate, thereby preventing the undercutting caused by the overetching of the channel layer. Thus, subsidence and separation of the drain electrode formed on the channel layer may be prevented.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. An array substrate comprising:
   a substrate;
   a switching element comprising:
      a gate electrode formed on the substrate;
      a channel layer formed on the gate electrode;
      a source electrode; and
      a drain electrode which are formed on the channel layer;
   an insulating layer formed on the source electrode and the drain electrode; and
   a pixel electrode formed on the insulating layer and electrically connected to the drain electrode through a contact hole, wherein the contact hole comprises a first part extending to a stepped portion of the drain electrode such that the contact hole has steps at its base, the channel layer extends along the drain electrode, and the drain electrode covers a sidewall of the channel layer at least in an area near the contact hole.

2. The array substrate of claim 1, wherein the insulating layer comprises a passivation layer.

3. The array substrate of claim 1, wherein the contact hole has a substantially rectangular shape.

4. The array substrate of claim 3, wherein the contact hole further comprises a second part extending to the substrate.

5. The array substrate of claim 1, wherein the contact hole has a U-shape.

6. The array substrate of claim 5, wherein the first part corresponds to a curved portion of the U-shape.

7. The array substrate of claim 5, wherein the contact hole comprises a second part extending to the substrate and the second part corresponds to end portions of the U-shape.

8. A method of manufacturing an array substrate comprising:
   forming a gate line and a gate electrode connected the gate line on a substrate;
   forming a channel layer on the gate electrode;
   forming a source line, a source electrode connected to the source line and a drain electrode on the channel layer;
   forming an insulating layer on the source electrode and the drain electrode;
   forming a contact hole to partially expose the drain electrode by patterning the insulating layer; and
   forming a pixel electrode layer connected to the drain electrode through the contact hole on the insulating layer,
   wherein the contact hole has a first part extending to a stepped portion of the drain electrode such that the contact hole has steps at its base, the channel layer extends along the drain electrode, and the drain electrode covers a sidewall of the channel layer at least in an area near the contact hole.

9. The method of claim 8, wherein the insulating layer comprises a passivation layer.

10. The method of claim 8, wherein the contact hole has a substantially rectangular shape.

11. The method of claim 10, wherein the contact hole further comprises a second part extending to the substrate.

12. The method of claim 8, wherein the contact hole has a U-shape.

13. The method of claim 12, wherein the first part corresponds to a curved portion of the U-shape.

14. The method of claim 12, wherein the contact hole comprises a second part extending to the substrate and the second part corresponds to end portions of the U-shape.

15. A liquid crystal display panel comprising:
   a liquid crystal layer;
   a first substrate; and
   a second substrate positioned substantially parallel to the first substrate and combined with the first substrate to receive the liquid crystal layer, the second substrate comprising:
      a substrate;
      a switching element comprising a gate electrode formed on the substrate, a channel layer formed on the gate electrode, and a source electrode and a drain electrode which are formed on the channel layer;
      an insulating layer formed on the source electrode and the drain electrode; and
      a pixel electrode formed on the insulating layer and electrically connected to the drain electrode through a contact hole,
   wherein the contact hole comprises a first part extending to the drain electrode such that the contact hole has steps at its base, the channel layer extends along the drain electrode, and the drain electrode covers a sidewall of the channel layer at least in an area near the contact hole.

16. The liquid crystal display panel of claim 15, wherein the contact hole has a substantially rectangular shape.

17. The liquid crystal display panel of claim 16, wherein the contact hole further comprises a second part extending to the substrate.

18. The liquid crystal display panel of claim 15, wherein the contact hole has a U-shape.

19. The liquid crystal display panel of claim 18, wherein the first part corresponds to a curved portion of the U-shape.

20. The liquid crystal display panel of claim 18, wherein the contact hole comprises a second part extending to the substrate and the second part corresponds to end portions of the U-shape.

21. An array substrate comprising:
a substrate;
a switching element comprising:
  a gate electrode formed on the substrate;
  a channel layer formed on the gate electrode;
  a source electrode; and
  a drain electrode which are formed on the channel layer;
an insulating layer formed on the source electrode and the drain electrode; and
a pixel electrode formed on the insulating layer and electrically connected to the drain electrode through a contact hole, wherein the contact hole has a first part extending to the drain electrode and a second part extending to the substrate, the channel layer extends along the drain electrode, and the drain electrode covers a sidewall of the channel layer at least in an area near the contact hole.

22. An array substrate comprising:
a substrate;
a switching element comprising:
  a gate electrode formed on the substrate;
  a channel layer formed on the gate electrode;
  a source electrode; and
  a drain electrode which are formed on the channel layer;
an insulating layer formed on the source electrode and the drain electrode; and
a pixel electrode formed on the insulating layer and electrically connected to the drain electrode through a contact hole, wherein the contact hole has a first part extending to the drain electrode and has a U-shape, the channel layer extends along the drain electrode, and the drain electrode covers a sidewall of the channel layer at least in an area near the contact hole.

* * * * *